United States Patent
Schmidt (10) Patent No.: US 8,093,676 B2
(45) Date of Patent: Jan. 10, 2012

(54) SEMICONDUCTOR COMPONENT INCLUDING AN EDGE TERMINATION HAVING A TRENCH AND METHOD FOR PRODUCING

(75) Inventor: Gerhard Schmidt, Wernberg-Wudmath (AT)

(73) Assignee: Infineon Technologies Austria AG, Villach (AT)

( * ) Notice: Subject to any disclaimer, the term of this patent is extended or adjusted under 35 U.S.C. 154(b) by 592 days.

(21) Appl. No.: 12/166,531

(22) Filed: Jul. 2, 2008

(65) Prior Publication Data

US 2009/0008723 A1 Jan. 8, 2009

(30) Foreign Application Priority Data

Jul. 2, 2007 (DE) .................... 10 2007 030 755 U (51) Int. Cl.
*H01L 23/58* (2006.01)

(52) U.S. Cl. ........ 257/491; 257/168; 257/170; 257/171; 257/409; 257/487; 257/496; 257/544; 257/545; 257/546; 257/547; 257/620; 257/622; 257/E29.005; 257/E29.006; 257/E29.007; 257/E29.008; 257/E29.014

(58) Field of Classification Search .................. 257/168, 257/170, 171, 409, 491, 496, 544, 545, 546, 257/487, 547, 620, 622, E29.005, E29.006, 257/E29.007, E29.008, E29.014

See application file for complete search history.

(56) References Cited

U.S. PATENT DOCUMENTS

| 5,311,052 A | 5/1994 | Stengl et al. |
| 5,763,915 A | 6/1998 | Hshieh et al. |
| 6,885,061 B2 * | 4/2005 | Nakazawa et al. ............ 257/330 |
| 7,026,668 B2 * | 4/2006 | Hatakeyama et al. ........ 257/264 |
| 2007/0096172 A1 * | 5/2007 | Tihanyi et al. ................ 257/288 |

FOREIGN PATENT DOCUMENTS

| DE | 19742397 | 7/2000 |
| DE | 10057612 | 5/2002 |
| DE | 10312911 | 10/2004 |

(Continued)

OTHER PUBLICATIONS

Schmidt, G. et al., "Vertikaler Randabschluss mit drainseitiger Feldplatte," Siemens AG, pp. 1-7 (2005).

(Continued)

*Primary Examiner* — Jay C Kim
(74) *Attorney, Agent, or Firm* — Dicke, Billig & Czaja, PLLC (57) ABSTRACT

A semiconductor component includes a semiconductor body having a first side, a second side, an edge delimiting the semiconductor body in a lateral direction, an inner region and an edge region. A first semiconductor zone of a first conduction type is arranged in the inner region and in the edge region. A second semiconductor zone of a second conduction type is arranged in the inner region and adjacent to the first semiconductor zone. A trench is arranged in the edge region and has first and second sidewalls and a bottom, and extends into the semiconductor body. A doped first sidewall zone of the second conduction type is adjacent to the first sidewall of the trench. A doped second sidewall zone of the second conduction type is adjacent to the second sidewall of the trench. A doped bottom zone of the second conduction type is adjacent to the bottom of the trench. Doping concentrations of the sidewall zones are lower than a doping concentration of the bottom zone.

7 Claims, 7 Drawing Sheets

FOREIGN PATENT DOCUMENTS

| | | |
|---|---|---|
| EP | 0341453 | 8/1993 |
| JP | 07142713 | 6/1995 |
| WO | 0038242 | 6/2000 |
| WO | 2004107448 | 12/2004 |

OTHER PUBLICATIONS

Brieger, K.-P. et al., "Vergleich verschiedener planarer Passivierungstechniken für Halbleiterleistungsbauelemente," Archiv für Elektrotechnik, 72, pp. 89-94 (1989).

Celler, G.K., "Modification of Silicon Properties with Lasers, Electron Beams, and Incoherent Light," CRC Critical Reviews in Solid State and Materials Sciences, vol. 12, Issue 3, pp. 193-265.

Gerlach, Willi, "Thyristoren," CIP-Kurztiteiaufnahme der Deutschen Bibliothek Halbleiter-Elektronik, Band 12, 150-159 (1979).

Olson, G.L., et al., "Kinetics of Solid Phase Crystallization in Amorphous Silicon," Materials Science Reports 3, pp. 1-77 (1988).

Wondrak, Wolfgang, Erzeugung von Strahlenschaden in Silizium durch hochenergetische Elektronen under Protonen, Frankfurt am Main, pp. 1-3 (1985).

\* cited by examiner

SEMICONDUCTOR COMPONENT INCLUDING AN EDGE TERMINATION HAVING A TRENCH AND METHOD FOR PRODUCING

CROSS-REFERENCE TO RELATED APPLICATIONS

This Utility patent application claims priority to German Patent Application No. DE 10 2007 030 755.3-33 filed on Jul. 2, 2007, which is incorporated herein by reference.

BACKGROUND

Semiconductor components, for example, power semiconductor components, are known that have a semiconductor body and a pn junction in an inner region of a semiconductor body and an edge structure or an edge termination in an edge region of the semiconductor body.

A component structure having a pn junction is found both in bipolar components, such as diodes, bipolar transistors and IGBTs, and in unipolar components, such as MOSFETs. Although these components differ with regard to their behavior when they are driven in the on state, what is common to these components in the off state is that a space charge zone propagates, proceeding from the reverse-biased semiconductor junction, as the reverse voltage increases.

In vertical components, the pn junction runs substantially parallel to one of the sides of the semiconductor body. Without additional measures, in such components the dielectric strength is reduced in the regions which are adjacent to the pn junction in a lateral direction. This is usually the edge region of the semiconductor body, that is to say the region arranged adjacent to a side area or edge area of the semiconductor body that runs in a vertical direction between a first side and a second side of the semiconductor body. The inner region containing the pn junction usually has a larger area than the edge region.

In order to increase the dielectric strength in the edge region and thereby to achieve a voltage breakdown in the larger-area inner region by the maximum reverse voltages reached, a wide variety of edge terminations or edge structures are known. Such edge terminations have the task, when a reverse voltage is present, of reducing the curvature of the field line profile in the edge region and of reducing the field strengths that occur in the edge region relative to the field strengths that occur in the inner region.

SUMMARY

One embodiment of a semiconductor component includes a semiconductor body having a first side, a second side, an edge delimiting the semiconductor body in a lateral direction, and also having an inner region and an edge region arranged between the inner region and the edge in the lateral direction. In the semiconductor body, a first semiconductor zone of a first conduction type is arranged in the inner region and in the edge region, and a second semiconductor zone of a second conduction type complementary to the first conduction type is arranged in the inner region and is adjacent to the first semiconductor zone in a direction of the first side. The semiconductor component additionally includes a trench arranged in the edge region and having first and second sidewalls and a bottom, which extends into the semiconductor body proceeding from the first side, a doped first sidewall zone of the second conduction type, which is adjacent to the first sidewall of the trench, a doped second sidewall zone of the second conduction type, which is adjacent to the second sidewall of the trench, and a doped bottom zone of the second conduction type, which is adjacent to the bottom of the trench, and which is arranged within the first semiconductor zone. In this case, doping concentrations of the sidewall zones are lower than a doping concentration of the bottom zone.

In one embodiment, the trench with the doped sidewall and bottom zones adjacent to it forms an edge termination of the semiconductor component. Owing to the bottom zone of the complementary conduction type with respect to the conduction type of the first semiconductor zone, the bottom zone being doped more heavily than the sidewall zones, it is not necessary for the trench to extend, in a vertical direction, over the entire depth of the first semiconductor zone, in which an electric field builds up or a space charge zone propagates proceeding from the pn junction between the first and the second semiconductor zone when the component is turned off. In this case, the bottom zone influences the profile of the electric field in the region of the trench in such a way that the electric field strengths are lower there than in the inner region of the semiconductor body. The location of a first voltage breakdown when the maximum dielectric strength is exceeded lies in the inner region as a result.

In one embodiment, a dopant dose of the bottom zone, that is, a dopant dose introduced into the bottom of the trench for producing the bottom zone, is greater than $1 \cdot 10^{12}$ cm$^{-2}$, for example, while a dopant dose of the sidewall zones is less than or equal to $1 \cdot 10^{12}$ cm$^{-2}$, for example.

In on embodiment, the edge termination is suitable for any vertical power semiconductor components, that is, components in which, in the on state, a current flows in a vertical direction through the semiconductor body and which have, with the first semiconductor zone, a comparatively lightly doped semiconductor zone for taking up a reverse voltage. The edge termination is suitable in one embodiment for MOS transistors, such as MOSFET or IGBT, or diodes.

In the case of a MOS transistor, the first semiconductor zone forms a drift zone and the second semiconductor zone forms a body zone. In the case of this component, a connection zone doped more highly than the drift zone is adjacent to the drift zone, which connection zone forms a drain zone and, in the case of MOSFETs, is of the same conduction type as the drift zone and, in the case of an IGBT, is doped complementarily to the drift zone. A MOS transistor additionally includes a source zone of the first conduction type, which is separated from the drift zone by the body zone, and a gate electrode for controlling a channel in the body zone between the source zone and the drift zone, which is arranged adjacent to the body zone and which is dielectrically insulated from the body zone.

In the case of a diode, the first semiconductor zone forms a base zone and the second semiconductor zone forms a first emitter zone. In the case of such a component, a second emitter zone is adjacent to the base zone at a side remote from the first emitter zone, the second emitter zone being of the same conduction type as the base zone but doped more highly.

One embodiment of a method for producing an edge termination of a semiconductor component includes providing a semiconductor body having: a first side, a second side, an edge delimiting the semiconductor body in a lateral direction, an inner region and an edge region arranged between the inner region and the edge in the lateral direction, and a first semiconductor zone of a first conduction type, which is arranged in the inner region and in the edge region. A trench arranged in the edge region is produced in the semiconductor body, which trench has at least one elongated trench section having first and second sidewalls and a bottom and extends into the first semiconductor zone proceeding from the first side. After the trench has been produced, a first oblique implantation, a second oblique implantation and at least one further implantation are carried out. By using the first oblique implantation, dopant atoms of a complementary conduction type with respect to the first conduction type are implanted into the first sidewall, wherein an implantation angle is chosen in such a way that dopant atoms are implanted over the entire area of the first sidewall, but not into the bottom of the trench. By using the second oblique implantation, dopant atoms of a complementary conduction type with respect to the first conduction type are implanted into the second sidewall, wherein an implantation angle is chosen in such a way that dopant atoms are implanted over the entire area of the first sidewall, but not into the bottom of the trench. By using the further implantation, dopant atoms of the first conduction type are implanted into the bottom of the trench.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
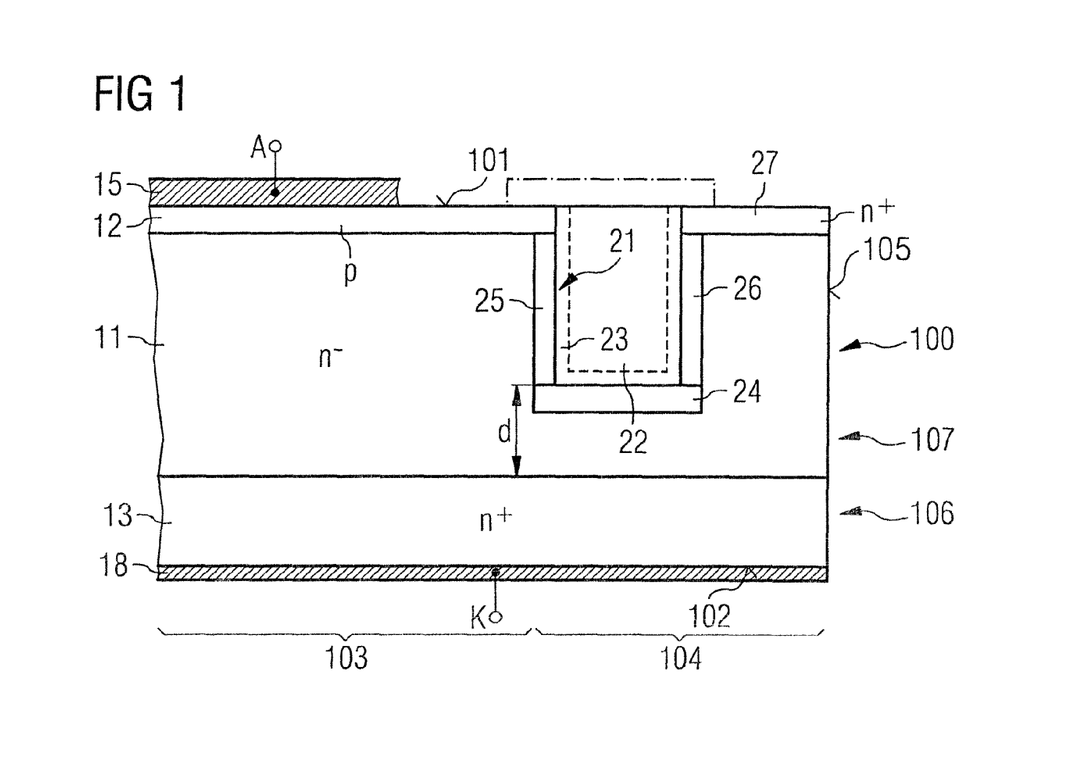
FIG. 1 illustrates a vertical cross section through a semiconductor body of a semiconductor component in accordance with one embodiment, which has an inner zone with a pn junction and an edge zone with an edge termination having a trench.
Figure 2:
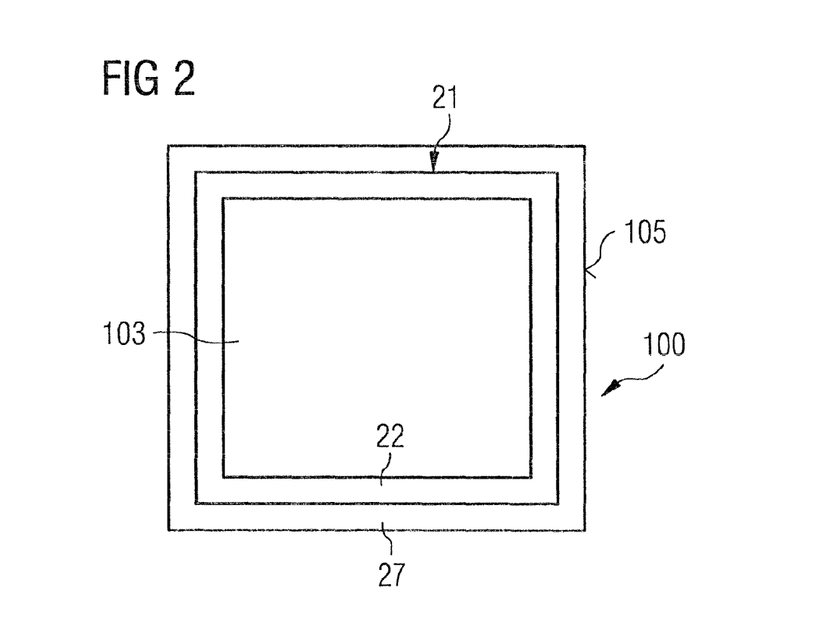
FIG. 2 illustrates a plan view of the semiconductor component in accordance with FIG. 1.

FIG. 1 illustrates an excerpt from a vertical cross section through a semiconductor body 100 of an exemplary embodiment of a semiconductor component. The semiconductor body 100 has a first side 101, which is referred to hereinafter as front side, and a second side 102 opposite the first side 101, the second side being referred to hereinafter as rear side. In a lateral direction, the semiconductor body 100 is delimited by an edge or an edge area 105, which runs in a vertical direction between the front side 101 and the rear side 102 in the example illustrated. Referring to FIG. 2, which illustrates a plan view of the front side 101 of the semiconductor body, the edge area 105 surrounds the semiconductor body 100, which is rectangular in plan view, on all sides. The semiconductor body 100 additionally has an inner zone 103 and an edge zone 104 arranged between the inner zone 103 and the edge region 105 in a lateral direction, an edge termination yet to be explained being arranged in the edge zone.

The component illustrated includes a first semiconductor zone 11 of a first conduction type, which is arranged both in the inner zone 103 and in the edge zone 104, and a second semiconductor zone 12 of a second conduction type complementary to the first conduction type, the second semiconductor zone being adjacent to the first semiconductor zone 11 in a direction of the front side 101 in the inner zone 103. A connection zone 13 is adjacent to the first semiconductor zone 11 in a direction of the rear side 102, the connection zone, in the example illustrated, being of the same conduction type as the first semiconductor zone 11 but doped more highly.

The component illustrated is realized as a power diode. The first semiconductor zone 11 and the connection zone 13 are n-doped in the example, and the second connection zone 12 is p-doped. However, these component zones could correspondingly also be doped complementarily.

In the case of the diode illustrated, the first semiconductor zone 11 forms a base zone or drift zone. In the example, the second semiconductor zone 12 forms a p-type emitter zone, and the connection zone 13 forms an n-type emitter zone. Contact is made with the p-type emitter zone 12 by using a first connection electrode 15, which forms an anode electrode of the diode, while contact is made with the n-type emitter zone 13 by using a second connection electrode 18, which forms a cathode electrode of the diode.

When the component is driven in the off state, that is to say in the example, when a negative voltage is applied between the p-type emitter 12 and the n-type emitter 13, a space charge zone propagates in the drift zone 11 proceeding from the pn junction. In this case, equipotential lines of an electric field run approximately parallel to the pn junction in the inner zone 103.

The pn junction between the first semiconductor zone 11 and the second semiconductor zone 12 ends in the inner region 103. Without additional measures, in the case of a component of this type, in the off-state case, a field strength higher than in the inner region 103 would occur in the edge region, such that, upon a maximum dielectric strength being reached, a voltage breakdown would occur in the edge region 104. In order to avoid destruction of the component when the maximum dielectric strength is reached, however, it is desirable to concentrate such a voltage breakdown on the inner region 103, which usually has a larger area than the edge region 104. In the case of the semiconductor component illustrated in FIG. 1, this is achieved by using an edge termination arranged in the edge region 104. The edge termination has a trench 21, which extends into the semiconductor body 100 in a vertical direction proceeding from the front side 101 and which is delimited by first and second sidewalls in a lateral direction and by a bottom in a vertical direction. The trench is filled with a dielectric 22. There is optionally the possibility of applying a passivation layer 23 to the sidewalls and at the bottom of the trench and of filling a residual trench that then still remains with a dielectric layer, such as a polyamide, for example. The passivation layer is for example a semi-insulating passivation layer, for example amorphous carbon with hydrogen doping (aC:H) or without hydrogen doping (aC), amorphous silicon with hydrogen doping (aSi:H) or without hydrogen doping (aSi) or amorphous silicon carbide with halogen doping (aSi$_x$C$_{1-x}$:H) or without halogen doping (aSi$_x$C$_{1-x}$). In this case, x denotes the proportion of silicon (Si) and 1-x denotes the proportion of carbon (C) in the silicon carbide (SiC). In this case, the composition of the SiC composed of Si and C can be stochiometric or non-stochiometric.

In principle, any undoped or weekly doped amorphous or polycrystalline materials, in one embodiment including undoped or weakly doped polysilicon, are suitable as the passivation layer.

In addition to known dielectric materials such as oxides, for example, amorphous or polycrystalline semiconductor materials having a high resistivity of greater than $10^8$ Ω·cm are also suitable as material for the dielectric 22.

The trench 21 is arranged at a distance from the edge area 105 of the semiconductor body 100 in a lateral direction and referring to FIG. 2, surrounds the inner zone 103 of the semiconductor body 100 in ring-shaped fashion. For explanation purposes it is assumed for the illustration in FIG. 2 that the trench 21 is spaced apart from the edge area 105 to the same extent in each case toward all the edge side. This is not a necessity, however. What is essential is that the trench 21 of the edge termination completely surrounds a semiconductor zone of the power semiconductor component that takes up the reverse voltage, that is to say the drift zone 11 in the case of the power diode in accordance with FIG. 1; in a lateral direction. In a manner not illustrated in more specific detail, there is also the possibility in this case of integrating further components not having a high dielectric strength, such as logic components for example, between the trench at the edge termination and the edge area 105.

The edge termination has a doped bottom zone 24, which is adjacent to the bottom of the trench 21 in the vertical direction of the semiconductor body 100, and has first and second doped sidewall zones 25, 26, which are adjacent to a respective one of the sidewalls of the trench 21 in a lateral direction of the semiconductor body. The bottom zone 24 and the sidewall zones 25 and 26 are doped complementarily to the first semiconductor zone 11, wherein the bottom zone 24 is doped more highly than the sidewall zones 25, 26. In this connection, "doped more lightly" means that a dopant dose of the sidewall zones 25, 26 relative to the area of the sidewalls is lower than a dopant dose of bottom zone 24 relative to the bottom area of the trench.

The sidewall zones 25, 26 each adjoin the bottom zone 24, such that these three semiconductor zones form a continuous semiconductor zone doped complementarily to the first semiconductor zone 11. The sidewall zone 25, 26 and the bottom zone 24 are in addition each adjacent to the first semiconductor zone 11 at the sides remote from the trench 21. The bottom zone 24 is thus arranged at a distance from the connection zone 13 in a vertical direction of the semiconductor body 100, and thus arranged completely within the first semiconductor zone 11.

The semiconductor body 11 can be constructed in multi-layer fashion and can have in one embodiment a semiconductor substrate 106, which forms the connection zone 13, and an epitaxial layer 107 applied to the semiconductor substrate 106. The epitaxial layer 107 can have a basic doping of the first conduction type, such that those sections of the epitaxial layer 107 which have the basic doping form the drift zone 11 of the semiconductor component. The remaining component zones explained hitherto, that is to say the second semiconductor zone 12, the bottom zone 24 and the sidewall zones 25, 26, can be produced by suitable doping methods in the epitaxial layer 107. Referring to previous explanations, in the case of such a semiconductor body having a semiconductor substrate 106 and an epitaxial layer 107, the bottom zone 24 does not reach as far as the semiconductor substrate 13. A thickness of the semiconductor substrate can be reduced to a desired thickness during a method for producing the component.

In the component illustrated in FIG. 1, the second semiconductor zone 12 reaches as far as the trench 21 of the edge termination in a lateral direction. Optionally, there is the possibility in this case of a doping concentration of the second semiconductor zone 12 decreasing in a direction of the trench 21, such that a section of the second semiconductor zone 12 which is directly adjacent to the trench 21 is doped more lightly than the remaining regions of the second semiconductor zone 12, which form a pn junction with the first semiconductor zone 11. What is essential in this connection is that the first semiconductor zone 11, in the inner region 103, does not reach as far as the front side 101 of the semiconductor body, that is to say that a semiconductor zone doped complementarily with respect to the first semiconductor zone 11 is present between the first semiconductor zone 11 and the front side 101. In other words: in a direction of the inner region, a semiconductor zone which is doped complementarily with respect to the first semiconductor zone 11 and which is formed by the first sidewall zone 25 and the second sidewall zone 12 is arranged between the trench and the first semiconductor zone 11. At that side of the trench 21 which is remote from the inner region 103, a channel stop zone 27 is optionally present in the region of the front side 101, the channel stop zone extending in a lateral direction from the trench 21 as far as the edge area 105 of the semiconductor body. The channel stop zone 27 is of the same conduction type as the first semiconductor zone 11 but doped more highly.

The doping concentration of the first semiconductor zone 11 lies for example between $1 \cdot 10^{14}$ cm$^{-3}$ and $5 \cdot 10^{14}$ cm$^{-3}$, in one embodiment in the region of $1.5 \cdot 10^{14}$ cm$^{-3}$. The dopant dose introduced into the second semiconductor zone is higher than the breakdown charge of the semiconductor material used, which is $1.6 \cdot 10^{12}$ cm$^{-2}$ for silicon. A resultant doping concentration of the second semiconductor zone 12 thus lies between $1 \cdot 10^{18}$ cm$^{-3}$ and $1 \cdot 10^{19}$ cm$^{-3}$, for example, depending on its vertical dimensions. The doping concentration in the connection zone 13 is for example in the range between $10^{16}$ cm$^{-3}$ and $10^{20}$ cm$^{-3}$, and that in the channel stop zone 27 is between $10^{18}$ cm$^{-3}$ and $10^{20}$ cm$^{-3}$.

Figure 3:
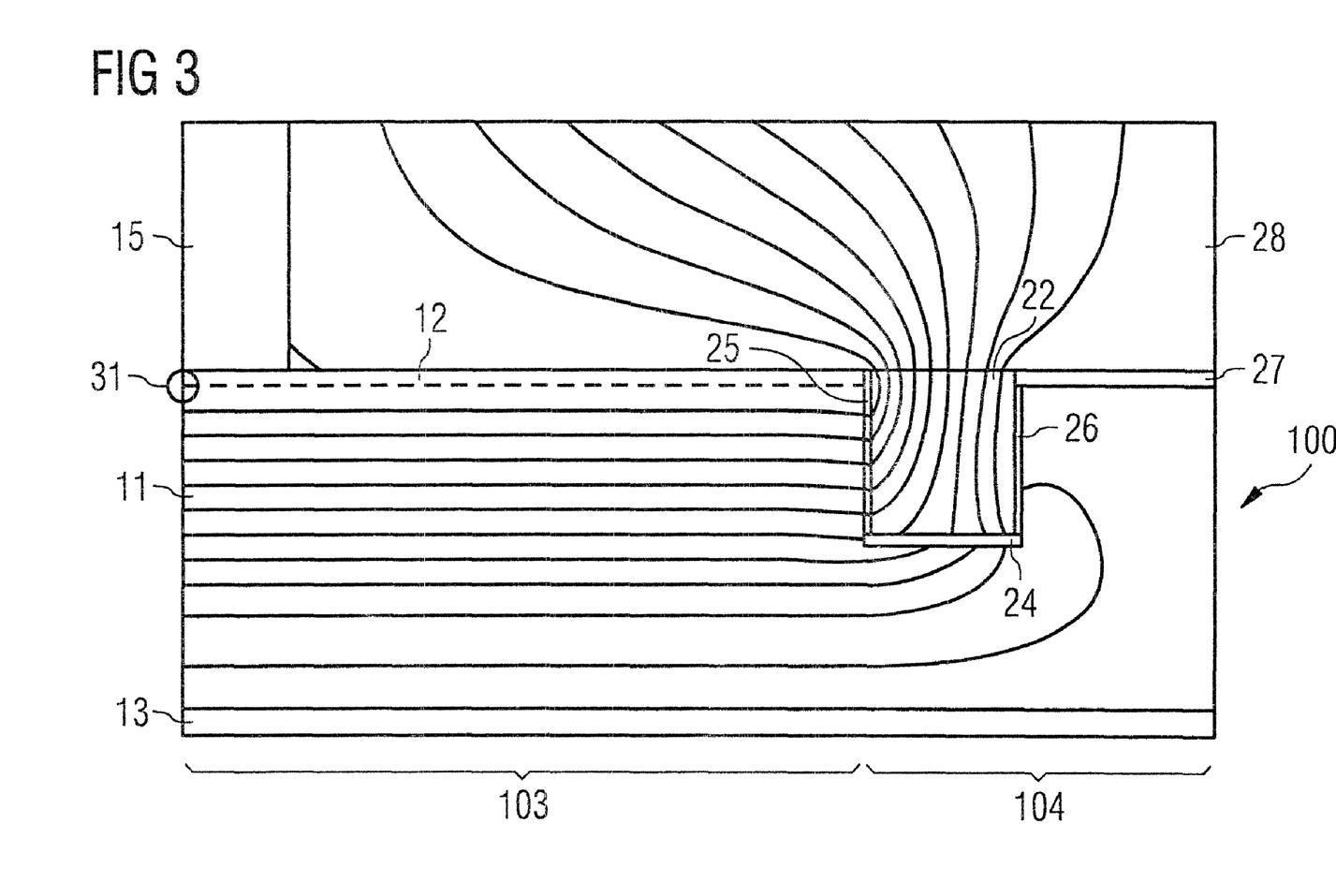
FIG. 3 illustrates the profile of the electrical potential distribution within the semiconductor body when the semiconductor component is driven in the off state.

The method of operation of the edge termination explained is explained below with reference to FIG. 3. FIG. 3 illustrates the potential profile of the electric field for the component explained with reference to FIG. 1 in the off-state case, that is to say upon application of a voltage that blocks the pn junction between the first and the second semiconductor zone 11, 12. FIG. 3 illustrates equipotential lines of an electric field that forms in the case of a locking pn junction in the first semiconductor zone 11, as solid lines. For elucidation purposes, the pn junction between the first and second semiconductor zones 11, 12 is illustrated in a dashed manner in FIG. 3. The reference symbol 28 in FIG. 3 designates a passivation layer arranged above the edge region 104. The passivation layer 28 is composed for example of a polyamide, a silicate glass, a silicate or a silicone.

The mutual distance between the equipotential lines illustrated in FIG. 3 is a measure of the field strength of the electric field represented by the equipotential lines. The field strength is all the higher, the smaller the distance between two adjacent equipotential lines. As can be seen from the profile of the equipotential lines, the edge termination with the trench, the sidewall zones 25, 26 and the bottom zone 24 leads to an "expanding" of the electric field in the edge region 104, in other words: a maximum electric field strength in the edge region 104 is lower than the maximum electric field strength in the inner region 103 of the semiconductor body 100. The reference symbol 31 in FIG. 3 designates the position of a possible voltage breakdown in the inner region 103 when the maximum dielectric strength of the component is reached. The bottom zone 24, adjacent to the trench in a vertical direction, has a significant influence on the profile of the electric field in the edge region 104. The dopant atoms present in the bottom zone 24 represent an opposing charge with respect to the dopant charges of the first semiconductor zone 11 which are present between the bottom zone 24 and the connection zone 13. In this case, a dopant dose of the bottom zone 24 is greater than a dopant dose of the sidewall zones 25 and 26. In this case, a dopant dose difference $\Delta D_p$ between a dopant dose of the bottom zone 24 and a dopant dose of the sidewall zones 25, 26 is dependent on a dopant concentration No of the first semiconductor zone 11 and a distance d between the trench 21 and the connection zone, wherein the difference increases as the doping concentration $N_D$ increases and the distance d increases. Depending on these two parameters, the following holds true for the dopant dose difference $\Delta D_p$, for example:

$$0.5 \cdot N_D \cdot d \leq \Delta D_p \leq 3 \cdot N_D \cdot d. \quad (1)$$

The dopant dose difference $\Delta D_p$ thus lies between 0.5 times and 2 times the product of the distance d and the doping concentration.

Without the bottom zone 24, the result would inevitably be an increase in the electric field strength in the edge region 104 and thus a first voltage breakdown in the edge region 104 instead of the inner region 103. In this case, the trench 21 would have to reach as far as the rear-side connection zone 13 in order to avoid the voltage breakdown in the edge region 104.

Figure 4:
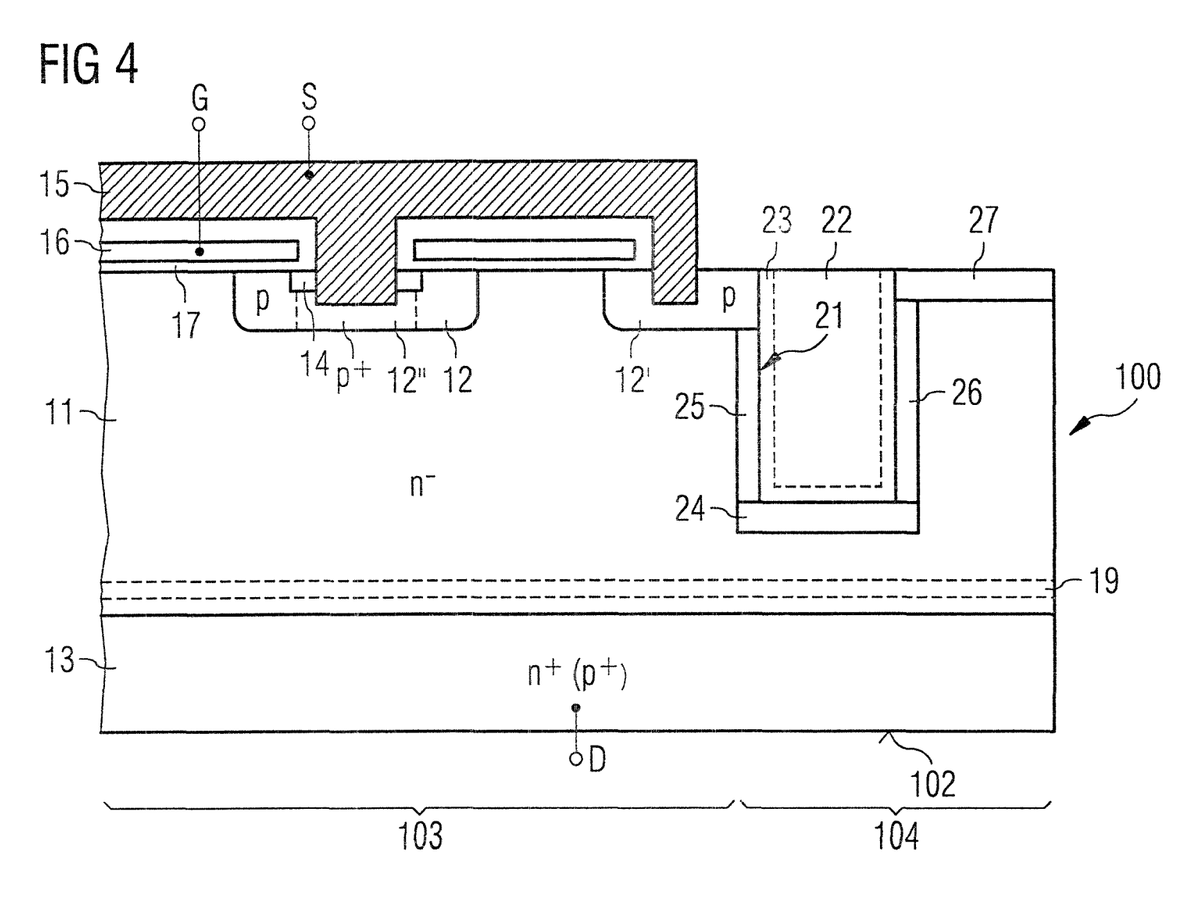
FIG. 4 illustrates one embodiment of a semiconductor component.

The edge structure explained with a trench 21, two sidewall zones 25, 26 and a bottom zone 24 can be applied to any vertical power semiconductor components, and is therefore not restricted to the power diode illustrated for explanation purposes in FIG. 1. FIG. 4 illustrates a semiconductor component embodied as a power MOS transistor and having such an edge termination. In the case of this MOS transistor, the first component zone 11 forms a drift zone, the second component zone 12 forms a body zone, and the connection zone 13 adjacent to the drift zone 11 at the opposite side to body zone 12 forms a drain zone. The MOS transistor can be realized as a MOSFET or as an IGBT. In the case of a MOSFET, the drain zone 13 is of the same conduction type as the drift zone 11 but doped more highly. In the case of an IGBT, the drain zone 13 is doped complementarily with respect to the drift zone 11. Optionally, a field stop zone can be present in the case of an IGBT, the field stop zone being of the same conduction type as the drift zone 11 and being arranged in the drift zone 11. The field stop zone 19 can be arranged at a distance from the drain zone 13 in a vertical direction, but can also be directly adjacent to the drain zone 13 (not illustrated). The doping types indicated in FIG. 4 relate to an n-channel MOSFET or n-channel IGBT. However, the invention is not restricted thereto, but can likewise be applied to a p-channel MOSFET or IGBT produced from the component illustrated in FIG. 4 by using a doping complementary to the doping indicted.

The MOS transistor additionally has a source zone 14, which is separated from the drift zone 11 by the body zone 12. A gate electrode 16 is present for controlling a conducting channel in the body zone 12 between the source zone 14 and the drift zone 11, the gate electrode being dielectrically insulated from the body zone 12 by a gate dielectric 17. In the example illustrated, the gate electrode 16 is realized as a planar gate electrode and is arranged above the front side 101 of the semiconductor body. In this component, a section of the drift zone 11 reaches as far as the front side 101. In a manner not illustrated more specifically, there is also a possibility, of course, of realizing the gate electrode as a trench electrode arranged in a trench extending into the semiconductor body proceeding from the front side 101.

The power MOS transistor illustrated in FIG. 4 can be constructed in cellular fashion, that is to say that it can have a multiplicity of transistor structures of identical type each having a body zone 12, a source zone 13 and a gate electrode 16, wherein contact is made with the source and body zones 12, 14 of all the transistor cells jointly by using the connection electrode 15, which forms a source electrode, and wherein all the transistor cells have either a common gate electrode or gate electrode sections at an identical electrical potential. A modified body zone 12' can be arranged at the edge of this transistor cell array, the body zone reaching as far as the trench 21 of the edge termination but no source zone being arranged in the body zone. Optionally, the individual body zones 12 can have more highly doped body zone sections 12" between the drift zone 11 and the source electrode 15, which body zone sections, particularly in the case of IGBTs, improve the latch-up behavior of the component and bring about a low contact resistance between the source electrode 15 and the body zone 12.

Although the power diode illustrated in FIG. 1 and the power MOS transistor illustrated in FIG. 4 differ in terms of their functioning in the on state, they are identical in terms of their functioning in the off state. In a manner corresponding to the diode, in the case of the MOS transistor in accordance with FIG. 4, in the off-state case, a space charge zone propagates proceeding from the pn junction between the body zone 12 and the drift zone 11. The explanations given above with regard to the functioning of the edge termination can thus also be correspondingly applied to the power MOS illustrated in FIG. 4.

Figure 5A:
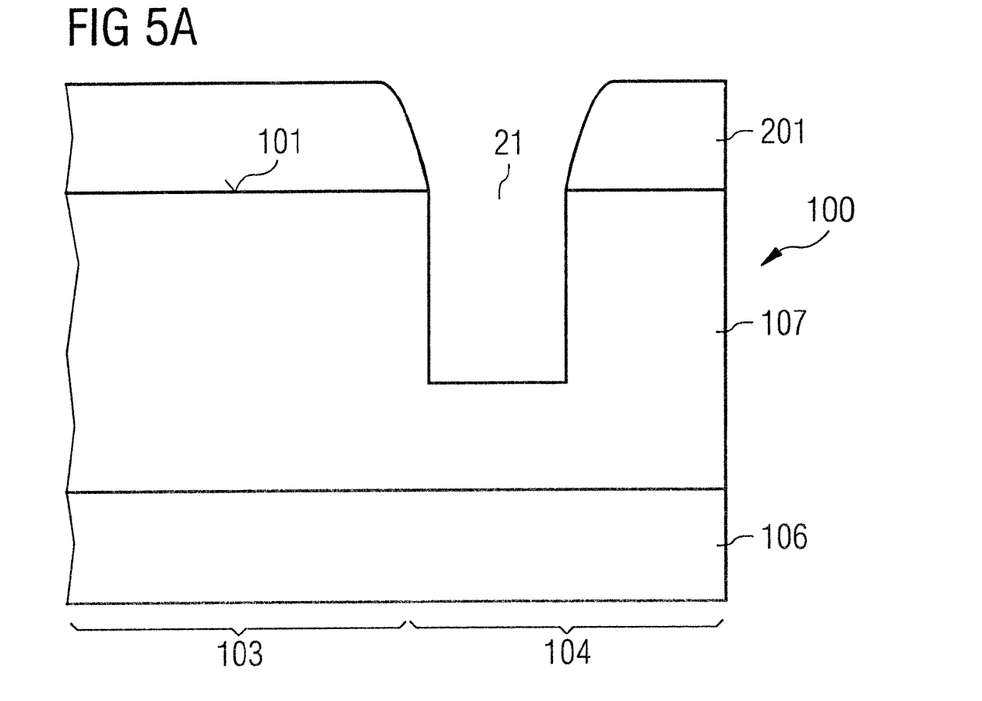
FIG. 5 illustrates a method for producing the edge termination.

A method for producing the edge structure explained above is explained below with reference to FIGS. 5A and 5B. FIG. 5A illustrates the semiconductor body 100 as an excerpt in cross section after the production of the trench extending into the semiconductor body 100 proceeding from the front side 101. The trench 21 is produced for example by using an etching method using a patterned mask layer 201 applied to the front side 101. The component zones of the semiconductor component which are arranged in the inner region 103 of the semiconductor body 100 are not illustrated in FIG. 5A. The component zones can be produced either before the production of the trench 21 or after the production of the trench by using sufficiently known processes, such that further explanations in this respect can be dispensed with.

Figure 5B:
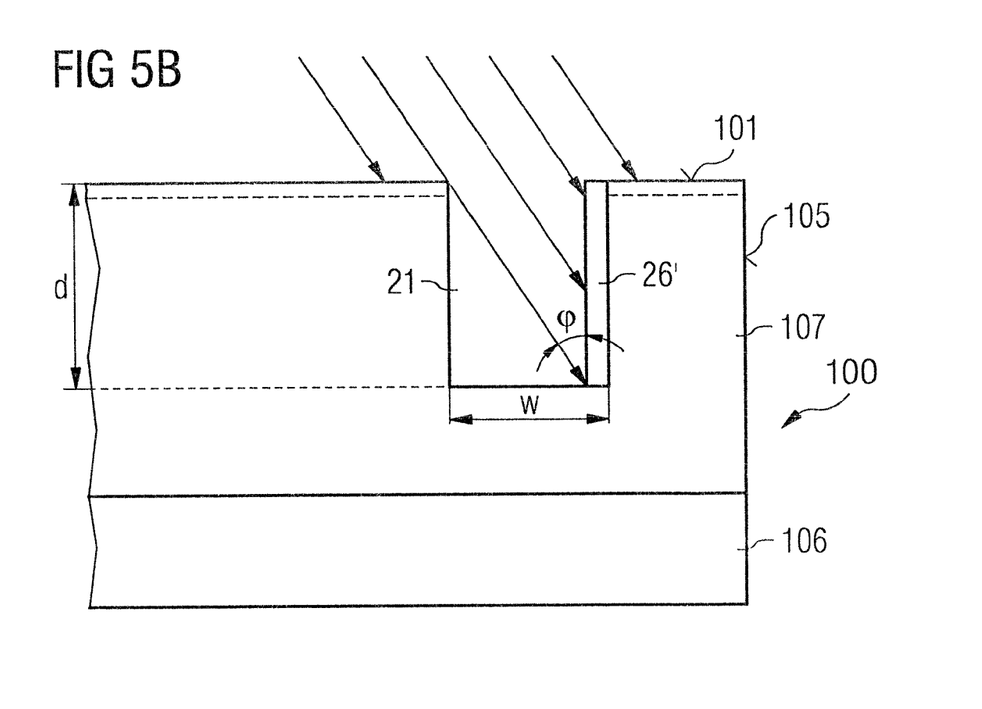

During a further method step, which is illustrated schematically in FIG. 5B, dopant atoms are introduced into the semiconductor body 100 via the sidewalls by using an oblique implantation method. FIG. 5B illustrates the semiconductor body 100 during the production of the sidewall zone 26 arranged in the direction of the edge area 105. The opposite sidewall zone is produced in a corresponding manner. An angle φ at which the oblique implantation is effected with respect to the perpendicular is chosen in this implantation method such that dopant atoms are implanted into the semiconductor body 100 as far as the bottom most end of the sidewall proceeding from the front side 101, but that no dopant atoms are implanted into the semiconductor body via the bottom of the trench 21. In this case, the "perpendicular" denotes the direction running perpendicular to the front side 101 of the semiconductor body. For such an exclusive doping of the sidewall, the implantation angle φ is chosen such that the following holds true:

$$\varphi = \arctan(w/d) \quad (2).$$

In this case, d denotes a depth of the trench 21 proceeding from the front side 101, w denotes a width of the trench in a lateral direction of the semiconductor body. The ratio w/d is also referred to as the aspect ratio of the trench. For a component having a dielectric strength of 600 V, the dimension of the drift zone (11 in FIGS. 1 and 4) in a vertical direction is approximately 55 μm, for example. This dimension corresponds approximately to the dimension of the epitaxial layer (107 in FIGS. 1 and 4), if it is assumed that the dimension of the second semiconductor zone (12 in FIGS. 1 and 4) in a vertical direction is very small in comparison with the dimension of the drift zone. In this case, the depth d of the trench 21 is 27 μm, for example, given a trench width of w=25 μm. The following then holds true for the implantation angle φ: φ≈43°.

Given an implantation dose of $Q_0$ relative to an area perpendicular to the implantation direction, the following holds true for an effective implantation dose at an implantation angle φ relative to the area of the sidewall: $Q = Q_0 \cdot \cos \varphi$. The reference symbol 26' in FIG. 5B denotes a region of the semiconductor body 100 which is adjacent to the sidewall, and into which the dopant atoms are implanted. In order to activate the dopant atoms, that is to say in order to complete the doped sidewall zone, a thermal step is still necessary by using which the semiconductor body is heated to a temperature suitable for the activation of the dopant atoms. This activation of the dopant atoms can be effected jointly for all the semiconductor zones that are implanted during the method for producing the semiconductor component.

The production of the first sidewall zone (25 in FIGS. 1 and 4) opposite the second sidewall zone is effected in accordance with the production of the second sidewall zone, wherein the implantation is in this case effected at an implantation angle of −φ with respect to the perpendicular.

In order to produce the bottom zone (24 in FIGS. 1 and 4) adjacent to the bottom of the trench 21, a further implantation step is effected, for example at an implantation angle φ=0°.

Figure 6A:
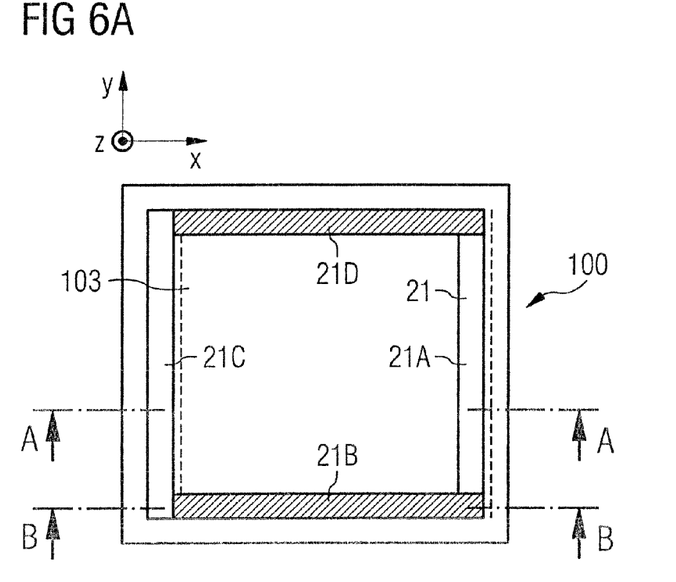
FIG. 6 illustrates a method for producing an edge termination having a trench that completely surrounds the inner zone of the semiconductor body.

A particularly effective method for producing the sidewall zones 25, 26 and the bottom zone 24 in a trench 21 rectangularly enclosing an inner region 103 of the semiconductor body is explained below with reference to FIGS. 6A to 6C. FIG. 6A illustrates the semiconductor body with the trench rectangularly enclosing the inner region 103 in plan view. The trench has four trench sections 21A-21D. In this case, two trench sections respectively, a first and a third trench section 21A, 21C and a second and a fourth trench section 21B, 21D, each run parallel to one another, wherein the two trench sections that run parallel to one another each run perpendicular to the other two trench sections that run parallel. In FIG. 6A, x and y denote two lateral directions of the semiconductor body 100 which run perpendicular to one another. For the purposes of the explanation below it should be assumed that the first and third trench sections 21A, 21C run with their longitudinal directions in the y direction and the second and fourth trench sections 21B, 21D run with their longitudinal directions in the x direction. In FIG. 6A, x denotes a vertical direction of the semiconductor body 100, which runs perpendicular to the two lateral directions x, y.

In order to produce the sidewall zones and the bottom zones, four oblique implantations are carried out in each case at identical angles φ with respect to the perpendicular, that is to say with respect to the vertical direction z, but at four different angles with respect to the lateral directions x, y.

Figure 6B:
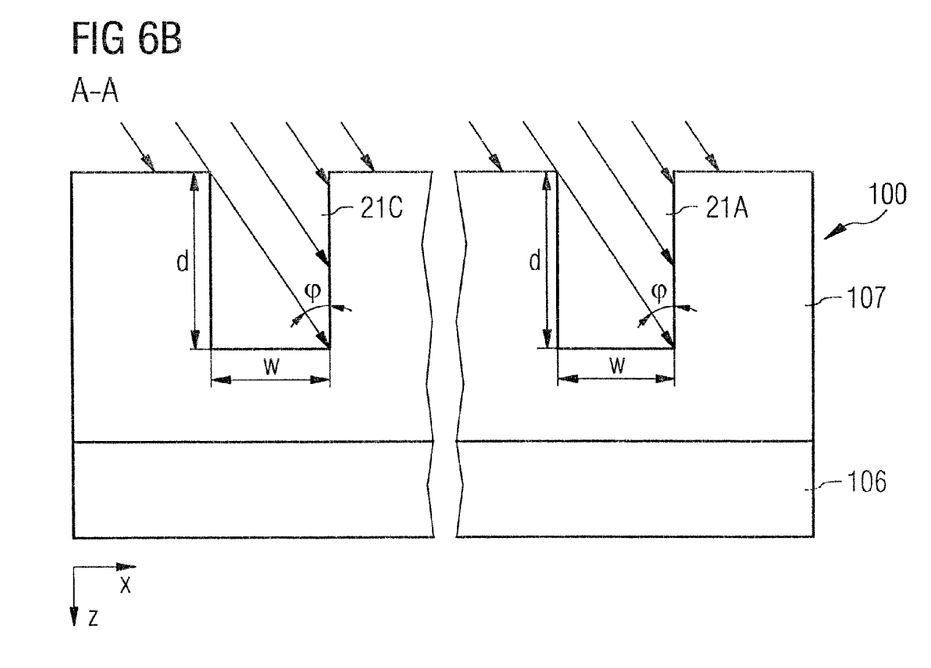

FIG. 6B illustrates the semiconductor body in cross section in a vertical sectional plane A-A during a first oblique implantation, in which dopant atoms are implanted into the semiconductor body at an angle φ with respect to the perpendicular z and at an angle θ=0° with respect to the lateral direction x. During this implantation step, dopant atoms are implanted into that side area of the first trench section 21A which is arranged in a direction of the edge area 105 and into that side area of the third trench section 21C which is arranged in a direction of the inner region 103. In this case, the implantation angle φ is chosen such that, in accordance with the previous explanations, dopant atoms in these trench sections 21A, 221C are implanted only into the sidewalls of these trench sections. Equation (2) correspondingly holds true for determining this angle depending on the trench depth b and the trench width d, where it is assumed that the individual trench sections, outside the corners that will be explained between individual trench sections, in each case have an identical width and an identical depth, but at least an identical aspect ratio, that is to say an identical ratio of width to depth. Implanted sidewall regions into which dopant atoms are implanted during the oblique implantation step illustrated in FIG. 6B are illustrated by dashed lines in FIG. 6A. During this implantation step, in the second and fourth trench sections 21B, 21D running perpendicular to the first and third trench sections 21A, 21C, dopant atoms are implanted into the bottom of the trenches, but not into the sidewalls thereof. The implanted bottom regions of the trenches are illustrated by dashed lines in FIG. 6A. These regions extend over the entire length of the second and fourth trench sections 21B, 21D and also contain the corners arranged between the first and fourth trench sections 21A, 21D and the first and second trench sections 21A, 21B. Given an implantation dose of $Q_0$ relative to a plane running perpendicular the implantation direction, the following holds true for an effective implantation dose $Q_s$ of the sidewalls: $Q_s = Q_0 \cdot \cos \varphi$. The following holds true for an effective implantation dose $Q_B$ of implanted bottom sections (illustrated by dashed lines in FIG. 6A): $Q_B = Q_0 \cdot \sin \varphi$.

Figure 6C:
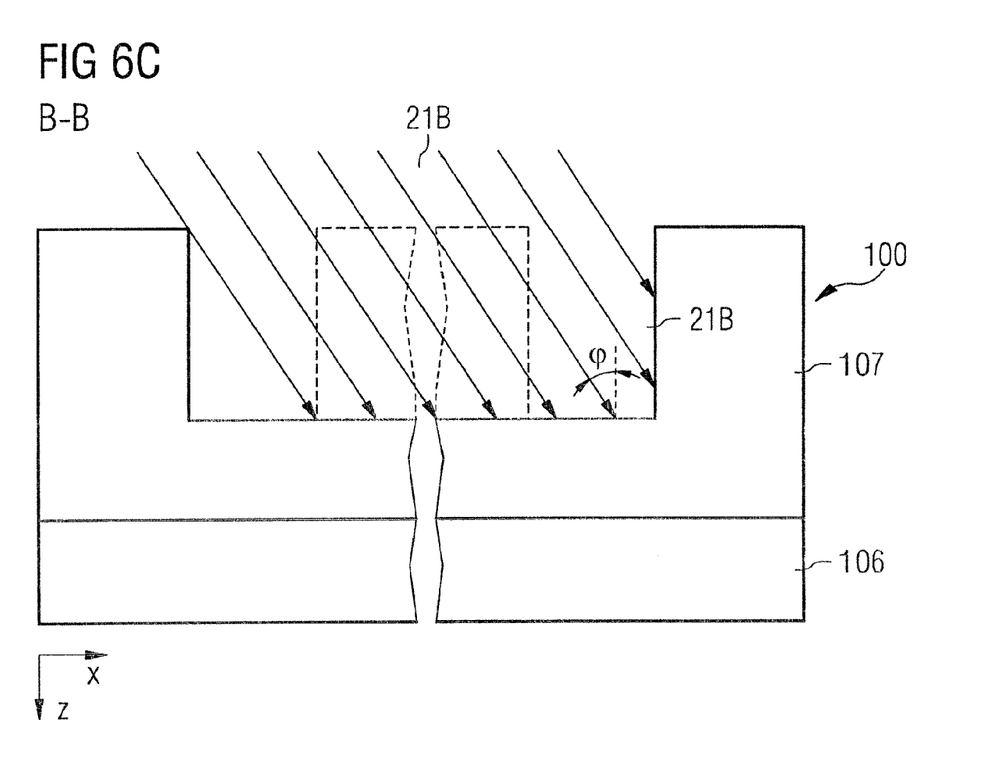

FIG. 6C illustrates a cross section through the semiconductor body in a vertical sectional plane B-B, which intersects the second trench section 21B in a longitudinal direction. FIG. 6C illustrates the implantation in this second trench section 21B during the oblique implantation step illustrated in FIG. 6B for the first and second trench sections 21A, 21B. As can be seen on the basis of FIG. 6C, during the implantation the corner lying between the second and third trench sections 21B, 21C is omitted if an implantation into the bottom of the corner lying between the first and second trench sections 21A, 21B is effected. The contours of the first and third trench sections 21A, 21C running perpendicular to the second trench section 21A, 21B are illustrated by dashed lines in FIG. 6C.

Figure 7:
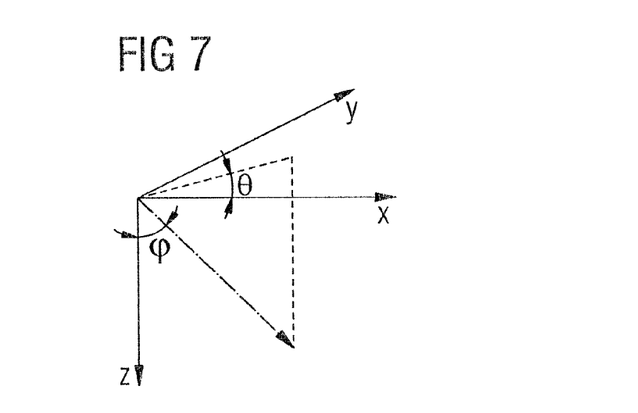
FIG. 7 serves for illustrating implantation directions in the method elucidated with reference to FIG. 6.

FIG. 7 illustrates the implantation angle φ with respect to the perpendicular and the implementation angle θ with respect to the first horizontal direction x.

The first oblique implantation step explained with reference to FIGS. 6B and 6C is followed by three further oblique implantation processes at in each case identical angles φ with respect to the perpendicular z. For the implantation angle θ with respect to the first horizontal direction, which is referred to hereinafter as lateral implantation angle, the following holds true for these three subsequent oblique implantation processes: θ=90°, θ=180° and θ=270°. It should be assumed for the explanation that for θ=90° referring to FIG. 6A, an implantation takes place into that sidewall of the fourth sidewall section 21D which is located in a direction of the edge area 105 and that side area of the second trench section 21B which is located in a direction of the inner region 103. During this implantation, dopant atoms are then implanted into the bottom of the first and fourth trench sections 21A, 21C and into the bottom of the corners between the fourth trench section 21D and the first and the third trench section 21A, 21C. During the third oblique implantation at the angle θ=180°, the dopant atoms are implanted into that sidewall of the third trench section 21C which is located in a direction of the edge area 105 and that sidewall of the first trench section 21A which is located in a direction of the inner region 103. At the same time, during this implantation, dopant atoms are positioned into the bottom of the second and fourth trench sections 21B, 21D and into the corners between the third trench section 21C and the first and the fourth trench section 21A, 21D. During the fourth oblique implantation at the angle θ=270°, dopant atoms are implanted into that sidewall of the second trench section 21B which is located in a direction of the edge area and into that sidewall of the fourth section 21D which is arranged in a direction of the inner region 102. At the same time, during this implantation step dopant atoms are implanted into the bottom of the first and third trench sections 21A, 21C and into the corners between the second trench section 21B and the first and the third trench section 21A, 21C.

As a result, during the oblique implantations previously explained here, dopant atoms are implanted into each of the in total eight sidewalls of the trench sections 21A-21D, to be precise exactly once in each of the sidewalls, such that $Q_s=Q_0 \cdot \cos \phi$ holds true for an effective dopant dose of the sidewalls. During the oblique implantations previously explained here, dopant atoms are implanted twice in each case into the bottom of the trench sections and the corners arranged between the trench sections. Thus, by way of example, dopant atoms are implanted into the second and fourth trench sections 21B, 21D during the first and the third oblique implantation step (θ=0° and θ=180°). In a corresponding manner, implantation is in each case effected twice into each of the corners arranged between the trench sections. Thus, an implantation takes place into the corner arranged between the first and second trench sections 21A, 21B during the first implantation step (θ=0°) and during the fourth implementation step (θ=270°). The following thus hold true for an effective implantation dose in the bottom region of the trench sections and the corners arranged between the trench sections: $Q_B=2 \cdot Q_0 \cdot \sin \phi$. Thus, all the doped sidewalls and all the bottom zones can be produced by just four implantation processes, wherein, owing to implantation twice into the bottom of the trenches, the dopant dose introduced into the bottom of the trenches is higher than the dopant dose introduced into the sidewalls of the trenches.

After the oblique implantation processes explained have been carried out, the trenches are filled with a dielectric layer, in which, before the dielectric layer is deposited, a passivation layer is optionally applied at least to the sidewalls and to the bottom of the trenches. In this case, the passivation layer and the dielectric layer can be deposited onto the front side 101 of the semiconductor body over the whole area. In order to remove the passivation layer above the inner region 103, by way of example, the dielectric layer subsequently deposited is patterned and used as a mask during the etching of the passivation layer.

In the methods explained with reference to FIGS. 5 and 6, the mask 201 used for etching the trenches 21, for example a TEOS hard mask, is removed after the etching of the trenches and before carrying out the implantation processes. In a manner not illustrated, the mask can also remain on the semiconductor body 100 during the implantation processes. When determining the implantation angle, the thickness of the hard mask should then be taken into account. The following then holds true for the implantation angle: $\phi=\arctan(w/d')$ where d' denotes the sum of the trench depth (d in FIGS. 5B and 6B) and the thickness of the hard mask. It should be noted in this connection that the illustration of the mask in FIG. 5A is not true to scale. The mask is deposited for example with a thickness of 2 μm and, after the etching of the trenches 21, then still has a thickness of approximately 1 μm, while the trench depth is usually greater than 10 μm. For the trench depth of 27 μm assumed by way of example above, no appreciable change in the implantation angle results despite the presence of a mask layer during the implantation.

It was assumed for the explanation above that the semiconductor body 100 has a highly doped semiconductor substrate and a more lightly doped epitaxial layer applied to the semiconductor substrate, the layer forming the later drift zone of the component. This should be understood merely as an example. Thus, the semiconductor body can initially also completely consist of a weakly doped semiconductor material having a basic doping corresponding to the doping of the later drift zone of the semiconductor component. After the edge termination structure explained above has been produced, the semiconductor body can be ground back or etched back proceeding from the rear side until a thickness required for the desired dielectric strength of the component is reached. Dopant atoms are subsequently implanted into the semiconductor body via the rear side in order to obtain a highly doped semiconductor zone which is adjacent to the rear side and which forms a rear-side emitter in the case of a power diode in accordance with FIG. 1 and a rear-side drain zone in the case of a power MOS transistor in accordance with FIG. 4. The explanations given above stating that the trench at the edge termination structure or the bottom zone adjacent to the bottom of the trench does not reach as far as the highly doped rear-side emitter or drain zone are correspondingly applicable for such a production method.

Figure 8:
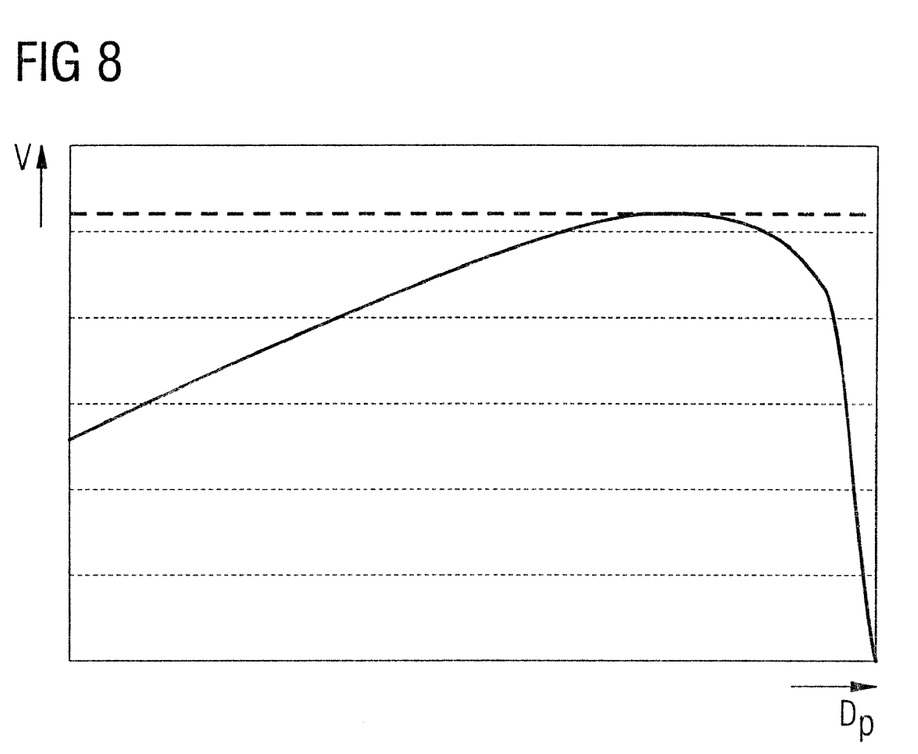
FIG. 8 illustrates a relationship between a reverse voltage of the semiconductor component and a dopant dose of a bottom zone arranged below the trench.

As already explained, the dopant dose of the bottom zone 24 crucially influences the profile of the electric field in the edge region 104 of the semiconductor body. The basic profile between a dopant dose $D_P$ at the bottom zone 24 and the dielectric strength V is illustrated in FIG. 8. In this case, the $V_{max}$ denotes a maximum dielectric strength depending on the semiconductor material used and the doping of the semiconductor zone or drift zone 11. As is illustrated in FIG. 8, the dielectric strength initially increases as the dopant dose $D_P$ increases, then remains at a value corresponding to the maximum dielectric strength $V_{max}$, and decreases again for a dopant dose $D_P$ increasing further. The case sought is the one in which the dielectric strength corresponds to the maximum dielectric strength $V_{max}$. In this case, a voltage breakdown occurs in the inner region of the semiconductor body and not in the edge region. For a component having a dielectric strength of 600V, vertical dimensions of the drift zone 11 of 55 μm and a trench depth of 27 μm, the range of the dopant dose of the bottom zone 24 for which a maximum dielectric strength is achieved lies between $D_P=1.1\cdot10^{12}$ cm$^{-2}$ and $D_P=1.3\cdot10^{12}$ cm$^{-2}$. Given a trench width of 25 μm and a resultant implantation angle of $\phi\approx43°$, it is possible to achieve such effective implantation doses at the bottom of the trench by using the method explained above in which implantation is effected twice into the bottom, for implantation doses between $Q_0=7.5\cdot10^{11}$ cm$^{-2}$ and $Q_0=9\cdot10^{11}$ cm$^{-2}$. In this case the effective sidewall doses are between $5.5\cdot10^{11}$ cm$^{-2}$ and $6\cdot10^{11}$ cm$^{-2}$ and thus considerably below the dopant dose at the bottom zone 24. In this case, the dopant dose at the bottom zone 24 should be less than the breakdown charge of the semiconductor material used. This dopant charge amounts to $1.6\cdot10^{12}$ cm$^{-2}$ for silicon.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
    a semiconductor body having a first side, a second side, an edge delimiting the semiconductor body in a lateral direction, and also having an inner region and an edge region arranged between the inner region and the edge in the lateral direction;
    a first semiconductor zone of a first conduction type, which is arranged in the inner region and in the edge region;
    a second semiconductor zone of a second conduction type complementary to the first conduction type, which is arranged in the inner region and which is adjacent to the first semiconductor zone in a direction of the first side;
    a trench arranged in the edge region and having first and second sidewalls and a bottom, which extends into the semiconductor body proceeding from the first side;
    a doped first sidewall zone of the second conduction type, which is adjacent to the first sidewall of the trench, a doped second sidewall zone of the second conduction type, which is adjacent to the second sidewall of the trench, and a doped bottom zone of the second conduction type, which is adjacent to the bottom of the trench, and which is arranged within the first semiconductor zone, wherein doping concentrations of the sidewall zones are lower than a doping concentration of the bottom zone and the doped first sidewall zone and the doped second sidewall zone are on opposite sides of the trench; and
    a third semiconductor zone of the first conduction type, adjacent to the first semiconductor zone in the edge region in a direction of the first side, doped more highly than the first semiconductor zone and extending in the lateral direction from the trench or the second sidewall zone as far as the edge.

2. The semiconductor component of claim 1, further comprising a connection zone of the first or second conduction type that is doped more highly than the first semiconductor zone and is adjacent to the first semiconductor zone in a direction of the second side.

3. The semiconductor component of claim 1, wherein the first and second sidewall zones adjoin the bottom zone.

4. The semiconductor component of claim 2, configured as a MOS transistor, wherein the first semiconductor zone forms a drift zone, the second semiconductor zone forms a body zone and the connection zone forms a drain zone, and which further comprises:
    a source zone of the first conduction type, separated from the drift zone by the body zone; and
    a gate electrode for controlling a channel in the body zone between the source zone and the drift zone, arranged adjacent to the body zone and which is dielectrically insulated from the body zone.

5. The semiconductor component of claim 4, wherein the drain zone is of the same conduction type as the drift zone.

6. The semiconductor component of claim 4, wherein the drain zone is of a complementary conduction type with respect to the conduction type of the drift zone.

7. The semiconductor component of claim 2, configured as a diode, wherein the first semiconductor zone forms a base zone and the second semiconductor zone forms a first emitter zone, and wherein the connection zone is of the same conduction type as the first semiconductor zone but doped more highly than the first semiconductor zone and forms a second emitter zone.

* * * * *